United States Patent
Rottmann et al.

(10) Patent No.: US 7,220,970 B2
(45) Date of Patent: May 22, 2007

(54) PROCESS AND DEVICE FOR MEASURING IONS

(75) Inventors: Lothar Rottmann, Ganderkesee (DE); Gerhard Jung, Delmenhorst (DE); Franz-Josef Mersch, Sottrum (DE)

(73) Assignee: Thermo Electron (Bremen) GmbH (DE)

( * ) Notice: Subject to any disclaimer, the term of this patent is extended or adjusted under 35 U.S.C. 154(b) by 68 days.

(21) Appl. No.: 11/015,405

(22) Filed: Dec. 17, 2004

(65) Prior Publication Data

US 2006/0151695 A1    Jul. 13, 2006

(51) Int. Cl.
*H01J 49/00* (2006.01)
(52) U.S. Cl. ............... 250/397; 250/310; 250/287; 250/281
(58) Field of Classification Search ........... 250/397
See application file for complete search history.

(56) References Cited

U.S. PATENT DOCUMENTS 5,471,059 A * 11/1995 Freedman et al. .......... 250/299
6,091,068 A    7/2000 Prfitt et al.
2002/0175292 A1 * 11/2002 Whitehouse et al. ....... 250/394

FOREIGN PATENT DOCUMENTS

JP    1132037     5/1989
JP    11096962 A  4/1999

* cited by examiner

*Primary Examiner*—Nikita Wells
*Assistant Examiner*—Phillip A. Johnston
(74) *Attorney, Agent, or Firm*—Laurence P. Colton; Powell Goldstein LLP

(57) ABSTRACT

The invention relates to a method and a device for the measurement of ions by coupling different measurement methods/techniques, a first detector being a collector (17) and a second detector being an SEM (18), and the ions to be measured or resulting secondary particles being selectively delivered to the collector or the SEM. The SEM (18) is operated selectively in analog mode or count mode. The collector (17) is provided with an integrator.

21 Claims, 4 Drawing Sheets

PROCESS AND DEVICE FOR MEASURING IONS

BACKGROUND OF THE INVENTION

1. Technical Field

The invention relates to a method and a device for the measurement of ions by coupling different measurement methods/techniques.

2. Prior Art

The measurement of ions is important particularly in connection with mass-spectrometric analysis methods. In the scope of materials analysis, for instance, ions are generated from a material sample, separated according to mass or other criteria and detected in a detector or a similar instrument.

Collectors, for example Faraday cups, are widely known detectors which can be used to measure the ion current as a voltage across a high resistance or in a high impedance amplifier. Secondary electron multipliers (SEMs) are also known. They operate with a conversion dynode at the input, on whose surface the incoming ions are neutralized and electrons are thereupon released. The electrons are then multiplied from stage to stage inside the SEM, so that even very small numbers of ions can be registered. It is also already known to operate an SEM in two different operating modes, namely analog mode and count mode. In order to record the electrons in analog mode, a signal is taken from one of the central stages. The count mode records the electrons arriving at the last stage of the SEM. The analog mode and count mode run in parallel with each other, for instance in the Finnigan Element 2 mass spectrometer from Thermo Electron. High ion currents can be measured using the analog mode, while the count mode evaluates the relatively smaller ion currents.

In particular applications, it is expedient to have a wide dynamic measurement range of more than nine orders of magnitude (more than $10^9$). In order to quantify minor impurities or doping in mass-spectrometric materials analysis, for example, such as laser ablation ICP mass spectrometry or glow discharge mass spectrometry (GD-MS), it is advantageous to be able to measure both the primary component (matrix) and the impurities or doping. It is also often advantageous to record a process gas used in the mass spectrometer (carrier), for example argon or other noble gases. For many applications, especially GD-MS, it is advantageous to lower the detection limit for impurities or doping. Minute traces of the components which are present should be detectable, if possible in the sub-ppb range, at the same time as the primary component (matrix). It is moreover desirable to take measurements efficiently and rapidly since, in GD-MS applications for example, analyte material is continually being eroded from the sample surface. The material composition may vary as a function of the depth of the sample.

BRIEF SUMMARY OF THE INVENTION

It is an object of the invention to carry out measurements in the shortest possible time over a wide dynamic range. A time of 1 ms per measurement channel should preferably be achieved. It is furthermore desirable to have a dynamic range of 12 orders of magnitude or more ($10^{12}$=sub-ppb), for example 1 cps to >$10^{12}$ cps.

The features of the method according to the invention is a method for the measurement of ions by coupling different measurement methods/techniques, a first detector being a collector and a second detector being an SEM, and the ions to be measured or resulting secondary particles being selectively delivered to the collector or the SEM. Accordingly, a first detector is a collector and a second detector is an SEM, the ions to be measured or resulting secondary particles being selectively delivered to the collector or the SEM. By coupling the two detector types, it is possible to cover a wide dynamic measurement range even for high ion currents.

The SEM is preferably operated selectively in analog mode and in count mode. This gives an even wider dynamic measurement range. The measurement ranges may also overlap one other. This may be advantageous for standardizing the measurements with respect to one another.

In particular, at least one Faraday cup is provided as the collector. This technique is known, and need not be explained further. According to another concept of the invention, the collector is operated with an integrating electronic circuit (integrator). This allows fast measurements in the range of 1 ms or less. Without an integrator, longer measurement times are often required since the transient and decay phenomena of the electrical quantities being measured then necessitate longer minimum measurement times.

According to another concept of the invention, the ions first generate secondary particles for measurement using the SEM, and then these secondary particles travel to the SEM. The secondary particles are generally electrons. They are generated outside the SEM, for instance at a separate conversion dynode. The advantages of this measure are the extended life of the SEM and a reduction in the mass dependencies of the measurement results.

The measurement ranges of the collector and of the SEM preferably overlap one other, in particular by at least two orders of magnitude ($10^2$). The same may apply to the measurement ranges inside the SEM, that is to say for the count mode on the one hand and the analog mode on the other hand. Overlap of the measurement ranges allows more straightforward calibration of the various measurement ranges with respect to one another. The different measurement ranges are preferably calibrated with respect to one another during the measurement.

The calibration is advantageously carried out by measuring the same ion mass for all measurement ranges, or at least for pairs of adjacent measurement ranges, and by matching the results. When using argon as the carrier gas, for example, an argon isotope with a suitable intensity such as the argon isotope with the mass number 36 may be used for calibrating all three measurement ranges. The mass spectrometer preceding the detector performs a scan over the relevant mass range. The results obtained can be presented in a diagram as a signal peak for said isotope. There is then an overlap of measurement ranges in a lower part of the leading peak edge and at the top of the peak. The measurement ranges may be calibrated with respect to one another while the measurement is running, so that the measurement results are immediately standardized with respect to one another.

The ions to be measured are preferably separated beforehand in a mass spectrometer. A double focusing mass spectrometer with a magnetic sector and an electrostatic sector, or a quadrupole mass spectrometer are preferred. Preferred techniques are ICP mass spectrometry, ICP mass spectrometry coupled with laser ablation or glow discharge mass spectrometry (GD-MS).

Preferred applications are mass-spectrometric materials analysis, for instance the measurement of impurities or doping in a primary component (matrix).

Another example of an application is GD-MS, with a depth profile of a material sample being compiled. The faster the detector operates and the faster the measurements can be carried out, the greater is the depth resolution.

Automatic switching between the individual detectors and the associated measurement ranges is advantageously provided. Only in this way is it feasible to compile a depth profile of a material sample consisting of different layers (with a widely varying element composition).

The device according to the invention for the measurement of ions has a collector as the first detector and an SEM as the second detector. A steering unit, for instance a deflector, is furthermore provided for selectively steering the ions or resulting secondary particles into the collector or the SEM.

According to another concept of the invention, the SEM may be preceded by a conversion dynode so that only electrons enter the SEM. These are formed at the conversion dynode after the ions impact on it. The conversion dynode is therefore not part of the SEM. This extends the life of the SEM. The mass dependency of any calibration is furthermore reduced.

The steering unit is advantageously arranged and aligned so that the ions travel to the collector in a setting in which there is no deflection or only minor deflection, and the ions or resulting secondary particles travel to the SEM in a setting in which deflection takes place.

The steering unit advantageously contains a conversion dynode so that the particles traveling from the deflector to the SEM are (secondary) electrons.

According to another concept of the invention, the steering unit contains a deflector electrode which is arranged between the conversion dynode and the SEM, the deflector electrode having at least one passage for the electrons. The deflector electrode is preferably designed in the shape of a ring or at least with a central opening, or as a grid for the electrons coming from the conversion dynode to pass through.

According to another concept of the invention, the SEM has at least two terminals (signal outputs), namely a terminal for an analog mode and a terminal for a count mode.

The device according to the invention may have a switching unit for switching between a signal output of the collector and the terminals of the SEM. Constant switching between the different detectors and/or between the terminals of the SEM is provided in order to cover a wider dynamic measurement range within a measurement. The switching unit may be part of an evaluation unit. It is preferable not to switch between the terminals of the SEM, but to record either the collector or both terminals of the SEM at the same time. Beyond a threshold, the count mode is automatically switched off and only the analog mode continues to be used, in order to protect the rear dynodes of the SEM against overload and to minimize nonlinearities and major dead time effects.

According to another concept of the invention, the collector is provided with an integrator for integrating the signal obtained from the collector. Usually, the ion current received by a collector is dissipated across a high resistance and the resulting voltage is measured. The voltage is then a measure of the ion current in question. The measurement time required for this is relatively long because of the transient and decay processes. The measurement time can be reduced by using the integrator at the collector, for instance a Faraday cup. Measurement intervals of only 1 ms are possible in this way, regardless of the signal level and even the signal level of the last measurement value. The integrator is a simple electronic circuit for adding up (integrating) the incident ion current, and need not be explained further.

According to another concept of the invention, a calibrating unit is provided for calibrating the results of the measurement using the collector with respect to the measurement by the SEM in analog mode, and for calibrating the results of the measurement by the SEM in analog mode and the SEM in count mode (or vice versa). It is expedient to produce the calibrating unit as software, namely as a component of software for evaluating the individual signals and/or as part of an evaluation unit.

Other features of the invention will become apparent from the patent claims and the description.

BRIEF DESCRIPTION OF THE DRAWINGS

Preferred embodiments of the invention will be presented in more detail below with reference to drawings, in which.

DETAILED DESCRIPTION OF THE PREFERRED EMBODIMENTS

Figure 1:
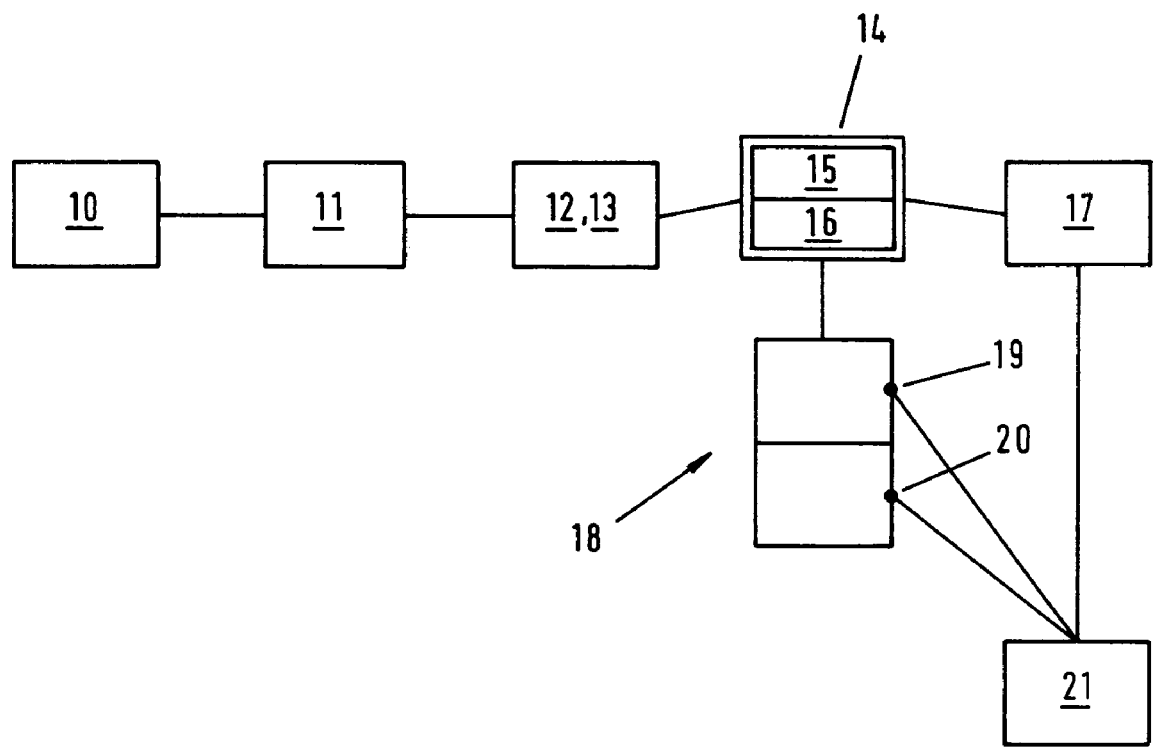
FIG. 1 shows a schematic arrangement of individual elements of a device according to the invention.

According to FIG. 1, ions from an ion source 10 are (optionally) separated in an analyzer 11 according to their mass-to-charge ratio or other criteria. The ion current coming from the analyzer 11 is processed by optional filter elements 12, 13. For example, 12 denotes ion optics and 13 denotes an energy filter.

The ion current then enters a steering unit 14 with an optional integrated or separate conversion dynode 15. In the present example, this is an integrated conversion dynode. In the steering unit 14, the ion beam is steered with the aid of at least one deflector electrode 16 into a collector 17, here designed as a Faraday cup, into a secondary electron multiplier (SEM) 18 or via the conversion dynode 15 into the SEM 18, depending on which operating mode is intended.

The SEM 18 has terminals (connections or signal outputs) 19, 20 for an analog mode and a count mode. The two measuring modes of the SEM 18 can be performed alternately or (preferably) at the same time.

The signals or information obtained by means of the two detectors (collector 17, SEM 18) are subjected to evaluation in an evaluation unit 21. All the necessary calculations are carried out in the evaluation unit 21. Logic-function interconnection of the evaluation unit 21 with a control unit (not shown) is also provided for the device as a whole.

Figure 2:
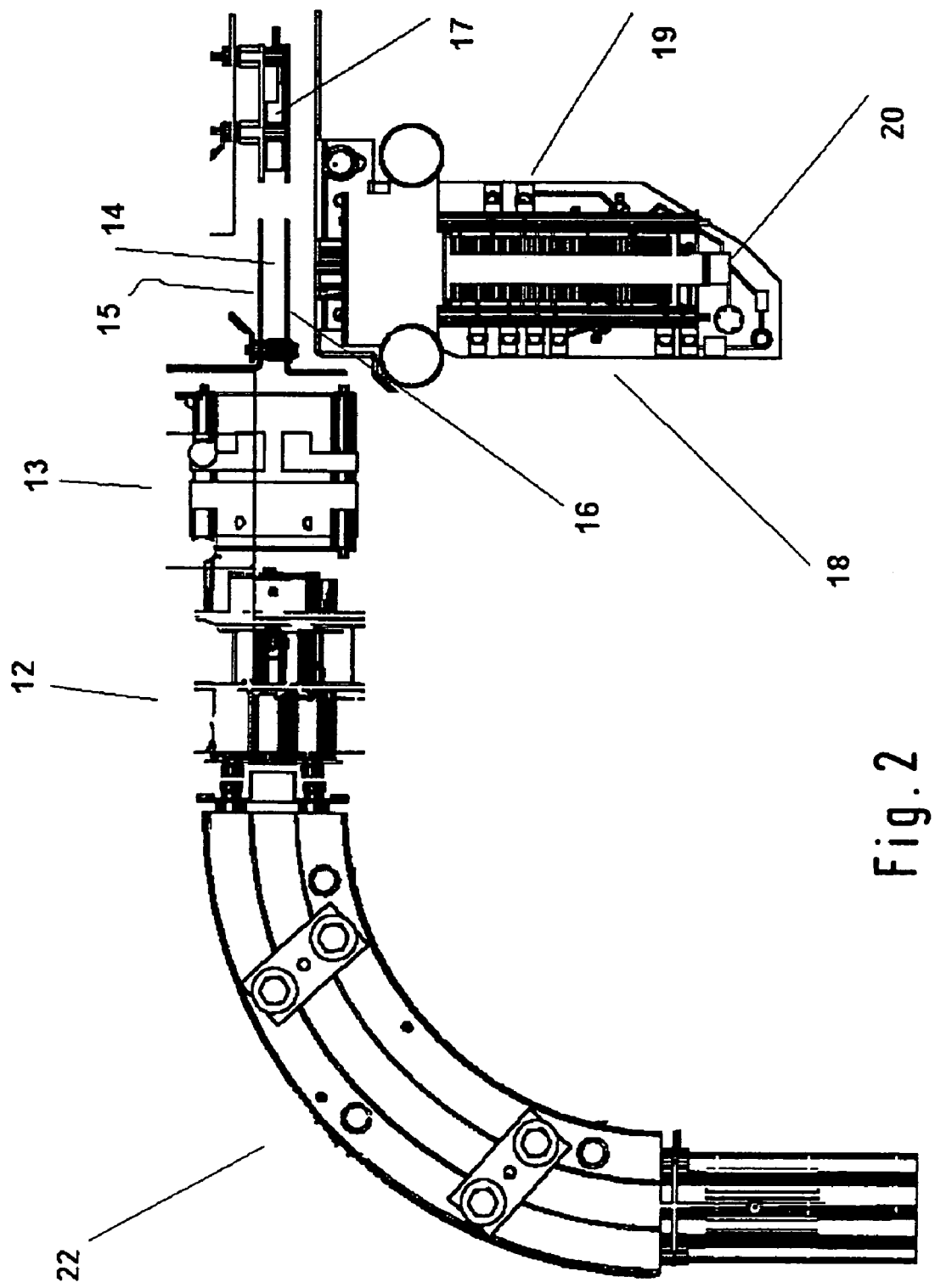
FIG. 2 shows a specific example of the arrangement according to FIG. 1.

FIG. 2 shows the multiplicity of aforementioned components in a specific arrangement. The ion source 10 is not indicated. Only part of the analyzer 11 is depicted, namely an electrostatic analyzer 12—here as part of a double focusing mass spectrometer. The ion source is preferably and ICP or GD (inductive coupled plasma/glow discharge) ion source.

The steering unit 14 is arranged so that an ion beam travels to the collector 17 if it is not deflected, or if it is deflected only to a minor extent. The conversion dynode 15 and the deflector electrode 16 are arranged mutually parallel, and preferably also essentially parallel to the ion beam emerging from the filter element 13. In this case, the deflector electrode 16 is provided between the conversion dynode 15 and the SEM 18. The deflector electrode 16 has at least one opening for the electrons formed from the ions at the conversion dynode 15 to pass through.

Measurements over a dynamic measurement range of more than 9 orders of magnitude ($10^9$) are possible with the device according to the invention and the method according to the invention. In particular, twelve orders of magnitude ($10^{12}$) can be measured. This is possible here owing to the relative arrangement of three measurement ranges, namely the measurement range of the collector 17 (Faraday cup) with an integrator, the measurement range of the SEM in analog mode and the measurement range of the SEM in count mode.

Figure 3:
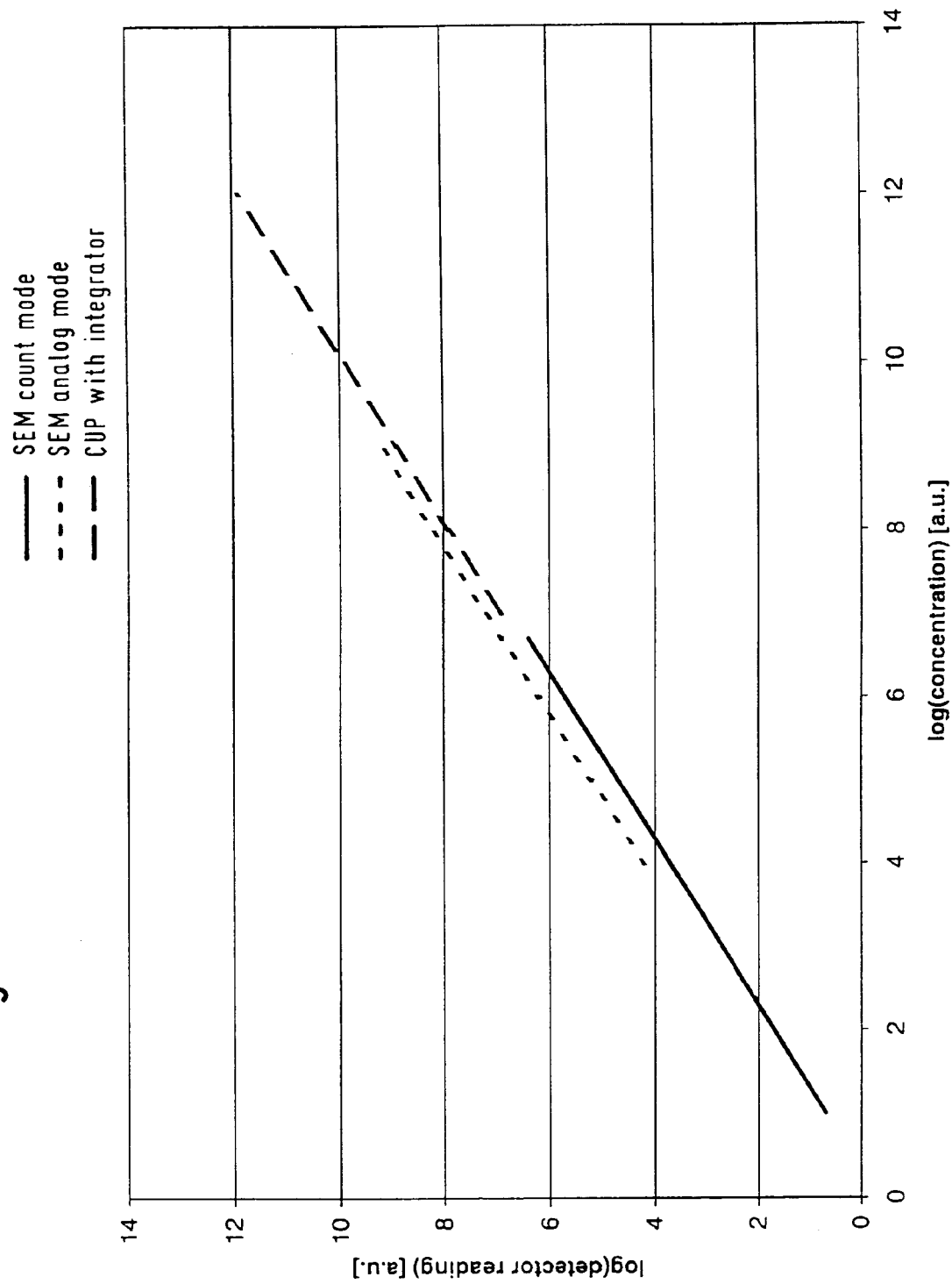
FIG. 3 shows a representation of the overlap of the measurement ranges within the device according to the invention.

Said measurement ranges overlap one another, preferably by two orders of magnitude ($10^2$) in each case. The overlap of the measurement ranges is shown in FIG. 3. The signal in question is represented as a function of an ion concentration. The measurement is carried out using the collector (dashed line) for the largest number of ions per unit time, using the analog mode (dotted line) for medium ion concentration and using the count mode (continuous line) of the SEM for the weakest ion concentration. Said three measurement ranges overlap one another so that the outer two ranges are almost contiguous.

An essential advantage of the mutually overlapping measurement ranges is the opportunity for automatic calibration while the measurement is running. The signals in the overlap range of two measurement ranges can be compared with each other and standardized with respect to each other, so that correction factors or summands can also be used outside the measurement-range overlaps.

Figure 4:
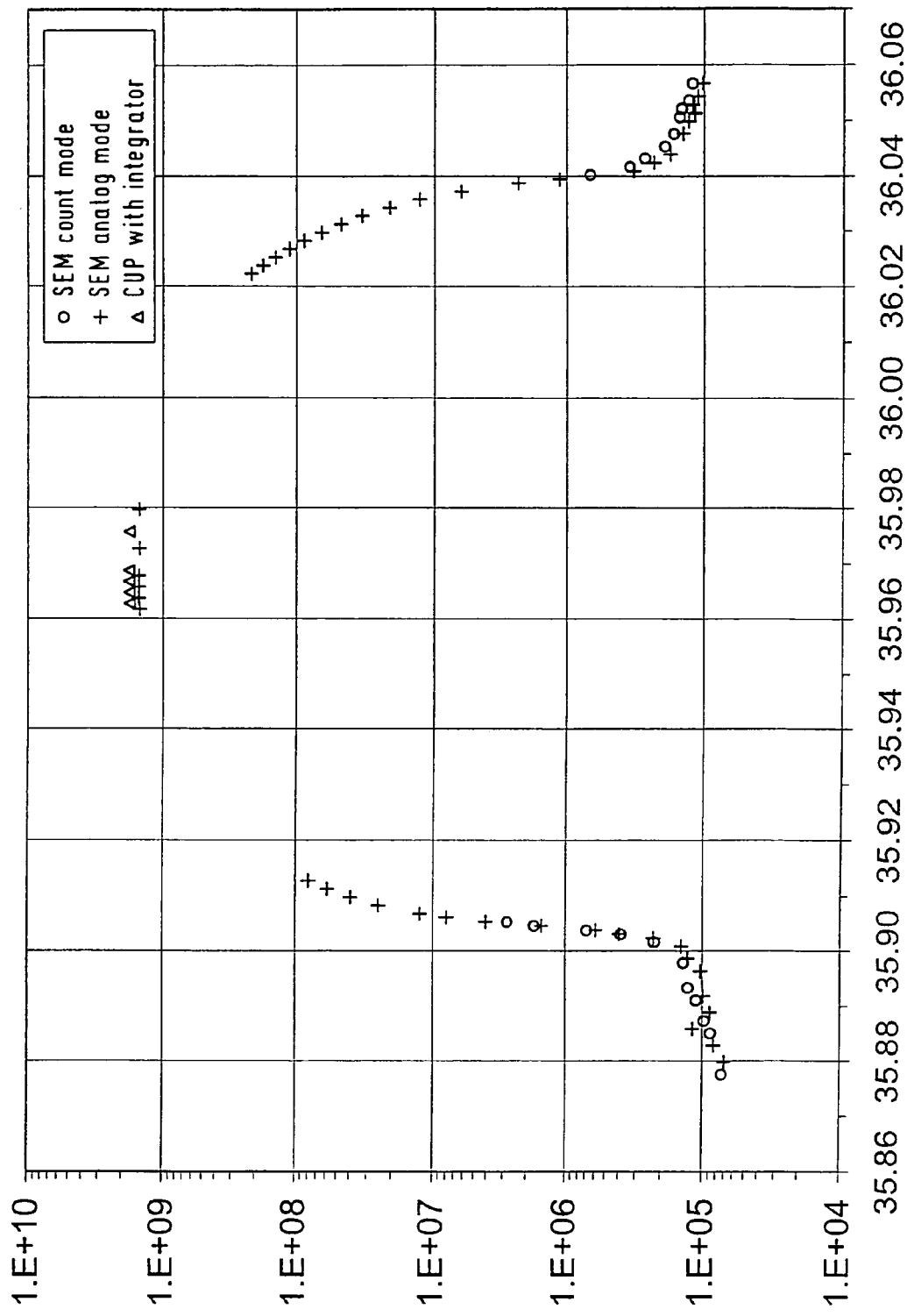
FIG. 4 shows a representation of the calibration of the different measurement ranges over the course of the peak of the argon isotope with the mass number 36.

FIG. 4 illustrates the calibration of the measurement ranges with reference to a specific example. In many applications, argon is used as a gas for generating the ions or as a carrier gas for the ion current. Argon can therefore be detected in the spectrum. FIG. 4 shows a selective scan by the mass spectrometer over a complete peak of the argon isotope with the mass number 36. The ion concentration is so great at the highest point of the peak (peak top) that measurements are possible in the collector measurement range and in the analog mode measurement range (SEM). These two measurement ranges are therefore calibrated with respect to each other during a scan over the peak top.

On the other hand, the measurement range for the analog mode and the measurement range for the count mode overlap each other in a lower range of the same peak, namely at the start of a leading edge or at the end of a trailing edge. Calibration of the two said measurement ranges with respect to each other is accordingly carried out there.

The particular advantage of this is that a calibration can be carried out comprehensively (for all the measurement ranges) during a single scan with the same ion mass.

List of references

10 Ion source
11 Analyzer
12 Filter element/Ion optics
13 Filter element/Energy filter
14 Steering unit
15 Conversion dynode
16 Deflector electrode
17 Collector
18 SEM
19 Terminal (analog mode)
20 Terminal (count mode)
21 Evaluation electronics
22 Electrostatic analyzer

What is claimed is:

1. A method for the measurement of ions coming from an analyzer (11) by coupling different measurement methods/techniques, a first detector being a collector (17) and a second detector being an SEM (18), comprising the steps of:
   selectively deflecting the ions to be measured and coming from the analyzer (11) to the collector or to the SEM after conversion to secondary particles,
   selectively operating the SEM (18) in analog mode or pulse counting mode, and automatically switching between the first and second detectors and the associated measurement ranges for carrying out measurements over a wide dynamic range.

2. The method as claimed in claim 1, wherein the collector (17) is operated with an integrator.

3. The method as claimed in claim 1, wherein for measurement using the SEM (18), the ions first generate the secondary particles and then the secondary particles travel to the SEM.

4. The method as claimed in claim 1, wherein the measurement ranges of the collector (17) and of the SEM (18) overlap each other.

5. The method as claimed in claim 1, wherein the measurement ranges of the count mode and the analog mode overlap each other.

6. The method as claimed in claim 4, wherein the different measurement ranges are calibrated with respect to one another during or before the measurement.

7. The method as claimed in claim 6, wherein the calibration is carried out by measuring the same ion mass for all measurement ranges and by matching the results.

8. The method as claimed in claim 1, wherein the ions to be measured are separated beforehand in the analyzer, which is a component of a mass spectrometer.

9. A device for the measurement of ions, comprising:
   an analyzer (11),
   a collector (17) as a first detector and an SEM (18) as a second detector, wherein the SEM (18) has at least two terminals (19,20) or signal outputs, namely at least a terminal (19) for an analog mode and a terminal (20) for a pulse counting mode,
   a steering unit (14) (deflector) for selectively steering the ions coming from the analyzer (11) deflecting to the collector or to the SEM after conversion to secondary particles, and
   a unit (21) for switching between a signal output of the collector (17) and the terminals (19, 20) of the SEM (18).

10. The device as claimed in claim 9, wherein the SEM (18) is preceded by a conversion dynode (15) so that only electrons enter the SEM.

11. The device as claimed in claim 9, wherein the steering unit (14) is arranged and aligned so that the ions travel to the collector (17) in a setting in which there is no deflection or only minor deflection, and the ions or resulting secondary particles travel to the SEM (18) in a setting in which deflection takes place.

12. The device as claimed in claim 9, wherein the steering unit (14) contains a conversion dynode (15) so that the particles travelling from the steering unit to the SEM (18) are (secondary) electrons.

13. The device as claimed in claim 12, wherein the steering unit (14) contains a deflector electrode (16) arranged between the conversion dynode (15) and the SEM (18), and which has at least one passage for the electrons.

14. The device as claimed in claim 9, wherein the collector (17) is provided with an integrator for integrating the signal obtained from the collector.

15. The device as claimed in claim 9, having a unit (21) for calibrating the results of the measurement using the collector (17) with respect to the measurement by the SEM (18) in analog mode, and for calibrating the results of the measurement by the SEM in analog mode and the SEM in pulse counting mode.

16. The method as claimed in claim 5, wherein the different measurement ranges are calibrated with respect to each other during or before the measurement.

17. The method as claimed in claim 16, wherein the calibration is carried out by measuring the same ion mass for all measurement ranges and by matching the results.

18. The method as claimed in claim 1, wherein the measurement ranges of the collector (17) and of the SEM (18) overlap each other by at least two orders of magnitude.

19. The method as claimed in claim 1, wherein the measurement ranges of the pulse counting mode and the analog mode overlap each other by at least two orders of magnitude.

20. The method as claimed in claim 1, wherein:

the step of automatically switching between the first and second detectors comprises automatic switching between the collector (17) on one hand and both terminals (19, 20) of the SEM (18) on the other hand for carrying out measurements over a wide dynamic range, and further comprising the step of automatically switching off the pulse counting mode beyond a threshold of signal output so that the analog mode only is continuing to be used.

21. The device as claimed in claim 9, wherein the unit (21) switches between the collector (17) on one hand and both terminals (19, 20) of the SEM (18) on the other hand, and the unit (21) automatically switches off the pulse counting mode beyond a threshold of signal output so that the analog mode only is continuing to be used.

* * * * *